United States Patent
Reznicek et al.

(10) Patent No.: US 11,676,894 B2
(45) Date of Patent: Jun. 13, 2023

(54) RESISTANCE TUNABLE FUSE STRUCTURE FORMED BY EMBEDDED THIN METAL LAYERS

(71) Applicant: International Business Machines Corporation, Armonk, NY (US)

(72) Inventors: Alexander Reznicek, Albany, NY (US); Chih-Chao Yang, Glenmont, NY (US); Miaomiao Wang, Albany, NY (US); Donald Francis Canaperi, Bridgewater, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/166,252

(22) Filed: Feb. 3, 2021

(65) Prior Publication Data

US 2021/0159173 A1  May 27, 2021

Related U.S. Application Data

(63) Continuation of application No. 16/576,870, filed on Sep. 20, 2019, now Pat. No. 10,957,642.

(51) Int. Cl.
*H01L 23/525* (2006.01)

(52) U.S. Cl.
CPC ............... *H01L 23/5256* (2013.01)

(58) Field of Classification Search
CPC ......... H01L 23/62; H01L 23/525–5258; H01L 2924/1453; H01L 27/11206; G11C 17/14–165
See application file for complete search history.

(56) References Cited

U.S. PATENT DOCUMENTS

| 7,648,870 B2 | 1/2010 | Bae |
|---|---|---|
| 8,339,867 B2 | 12/2012 | Siau |

(Continued)

FOREIGN PATENT DOCUMENTS

WO  03085735  10/2003

OTHER PUBLICATIONS

Chen et al., "A Cost Effective 32nm High-K/ Metal Gate CMOS Technology for Low Power Applications with Single-Metal/Gate-First Process" Symposium on VLSI Technology Digest of Technical Papers 2008.

(Continued)

*Primary Examiner* — Laura M Menz
*Assistant Examiner* — Candice Chan
(74) *Attorney, Agent, or Firm* — Fleit Intellectual Property Law; Jose Gutman

(57) ABSTRACT

A semiconductor structure includes a resistance tunable fuse stack structure. A fabrication method for forming the same includes forming on a substrate layer a first fuse conductive layer, directly on, and contacting a top surface of, the substrate layer, followed by forming a first inter-layer dielectric (ILD) layer, directly on, and contacting a top surface of, the first fuse conductive layer. The method forms a second fuse conductive layer, directly on, and contacting a top surface of, the first ILD layer, followed by forming a second ILD layer, directly on, and contacting a top surface of, the second fuse conductive layer, the layers are interleaved in a stack forming a fuse stack structure. First and second fuse contacts are formed in the fuse stack structure vertically extending through the layers and contacting the first and second fuse conductive layers. Selection of various attributes of the fuse stack structure tunes a resistance of a fuse formed between the first and second fuse contacts in the fuse stack structure.

14 Claims, 9 Drawing Sheets

(56) References Cited

U.S. PATENT DOCUMENTS

| | | |
|---|---|---|
| 8,598,679 B2 | 12/2013 | Cheng et al. |
| 9,219,040 B2 | 12/2015 | Mann et al. |
| 10,192,823 B2 * | 1/2019 | Yoon .................... H01L 23/5256 |
| 2018/0323202 A1 * | 11/2018 | Cheng ................. H01L 23/5256 |
| 2019/0066812 A1 | 2/2019 | Yeap et al. |
| 2020/0194599 A1 | 6/2020 | Phoa et al. |

OTHER PUBLICATIONS

List of IBM Patents or Patent Applications Treated as Related.

\* cited by examiner

RESISTANCE TUNABLE FUSE STRUCTURE FORMED BY EMBEDDED THIN METAL LAYERS

BACKGROUND

The present invention generally relates to the field of semiconductors, and more particularly relates to a method of fabricating fuses on-chip in semiconductor structures.

Fuses are used in a variety of circuit applications and are needed in many technologies. It is highly desired to fabricate on-chip fuses close to semiconductor devices in support of circuit operation and to improve overall system integration.

A fuse fabricated on-chip typically has a single fixed fuse resistance value. The single fuse resistance value is fixed as part of an overall circuit design and a process of fabrication of a specific circuit application. There is no customization (tuning) of a fuse resistance value during fabrication of a chip.

Therefore, the inventors have discovered that there is a need for a new fabrication method of semiconductor structures that overcomes the above mentioned problems.

SUMMARY OF THE INVENTION

According to various embodiments, a semiconductor structure comprises a semiconductor material stack including a plurality of layers and a substrate; and a method of fabrication of a resistance tunable fuse semiconductor structure is disclosed. The semiconductor material stack includes at least one substrate layer and a substrate inter-layer dielectric (ILD) layer disposed directly on, and contacting a top surface of, the at least one substrate layer. The method includes depositing a first conductive material forming a first fuse conductive material layer of a first fuse layer thickness, directly on, and contacting a top surface of, the substrate ILD layer, followed by depositing a first dielectric material forming a first ILD layer of a first ILD thickness directly on, and contacting a top surface of, the first fuse conductive material layer. The method deposits a second conductive material forming a second fuse conductive material layer of a second fuse thickness, directly on, and contacting a top surface of, the first ILD layer, followed by depositing a second dielectric material forming a second ILD layer of a second ILD thickness directly on, and contacting a top surface of, the second fuse conductive material layer. The first fuse conductive material layer, the first ILD layer, the second fuse conductive material layer, and the second ILD layer, are interleaved with each other in a stack of layers forming a fuse stack semiconductor structure.

The method continues by performing a first vertical directional etch in the second ILD layer in the fuse stack semiconductor structure forming a first vertical fuse contact trench extending downward through the second ILD layer, the second fuse conductive material layer, and the first ILD layer, down to at or below the first fuse conductive material layer. A second vertical directional etch in the second ILD layer in the fuse stack semiconductor structure is performed, thereby forming a second vertical fuse contact trench extending downward through the second ILD layer, the second fuse conductive material layer, and the first ILD layer, down to at or below the first fuse conductive material layer.

The method deposits a contact fill conductive material in the first vertical fuse contact trench forming a first fuse contact, and depositing a contact fill conductive material in the second vertical fuse contact trench forming a second fuse contact. The fuse stack semiconductor structure can be located in close proximity to a metallization layer, such as a front end of line (FEOL) metallization layer, a middle of line (MOL) metallization layer, and a back end of line (BEOL) metallization layer. The resistance of the fuse stack semiconductor structure can be tuned (customized) by a semiconductor fabrication process. According to one example, a value of the impedance (e.g., resistance) of the fuse stack semiconductor structure can be tuned by any one or more of: selecting a type of conductive material of any of the first or second fuse conductive material layers; selecting a horizontal width (lateral patterning) of any of the first or second fuse conductive material layers, selecting a vertical thickness of any of the first or second fuse conductive material layers, or selecting a horizontal spacing in the fuse stack semiconductor structure between the first fuse contact and the second fuse contact.

According to various embodiments, a semiconductor structure comprises: a semiconductor material stack including at least one substrate layer and a substrate inter-layer dielectric (ILD) layer disposed directly on, and contacting a top surface of, the at least one substrate layer; and a fuse stack semiconductor structure disposed directly on the semiconductor material stack, the fuse stack semiconductor structure comprising: a first fuse conductive material layer, of a first fuse layer thickness, disposed directly on and contacting a top surface of the substrate ILD layer. A first ILD layer, of a first ILD thickness, is disposed directly on and contacting a top surface of the first fuse conductive material layer. A second fuse conductive material layer, of a second fuse layer thickness, is disposed directly on and contacting a top surface of the first ILD layer. A second ILD layer, of a second ILD thickness, is disposed directly on and contacting a top surface of the second fuse conductive material layer, wherein the first fuse conductive material layer, the first ILD layer, the second fuse conductive material layer, and the second ILD layer, are interleaved with each other in a stack of layers forming the fuse stack semiconductor structure. A first fuse contact, comprising conductive material, extends vertically downward through the second ILD layer, the second fuse conductive material layer, and the first ILD layer, down to at or below the first fuse conductive material layer. A second fuse contact, comprising conductive material, extends vertically downward through the second ILD layer, the second fuse conductive material layer, and the first ILD layer, down to at or below the first fuse conductive material layer.

The resistance of the fuse stack semiconductor structure can be tuned by changes to various attributes of the fuse stack semiconductor structure during a semiconductor fabrication process. For example, the type of conductive material of the first fuse conductive material layer can be different from the second fuse conductive material layer. The resistance value of the fuse stack semiconductor structure between the first and second fuse contacts can be tuned between multiple different values, such as low, medium, or high. This is a significant improvement over prior art fuses that can only be either low or high resistance values. According to various embodiments of the invention, any desired resistive value for a fuse can be selected by design according to a fabrication process after a chip has been formed.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
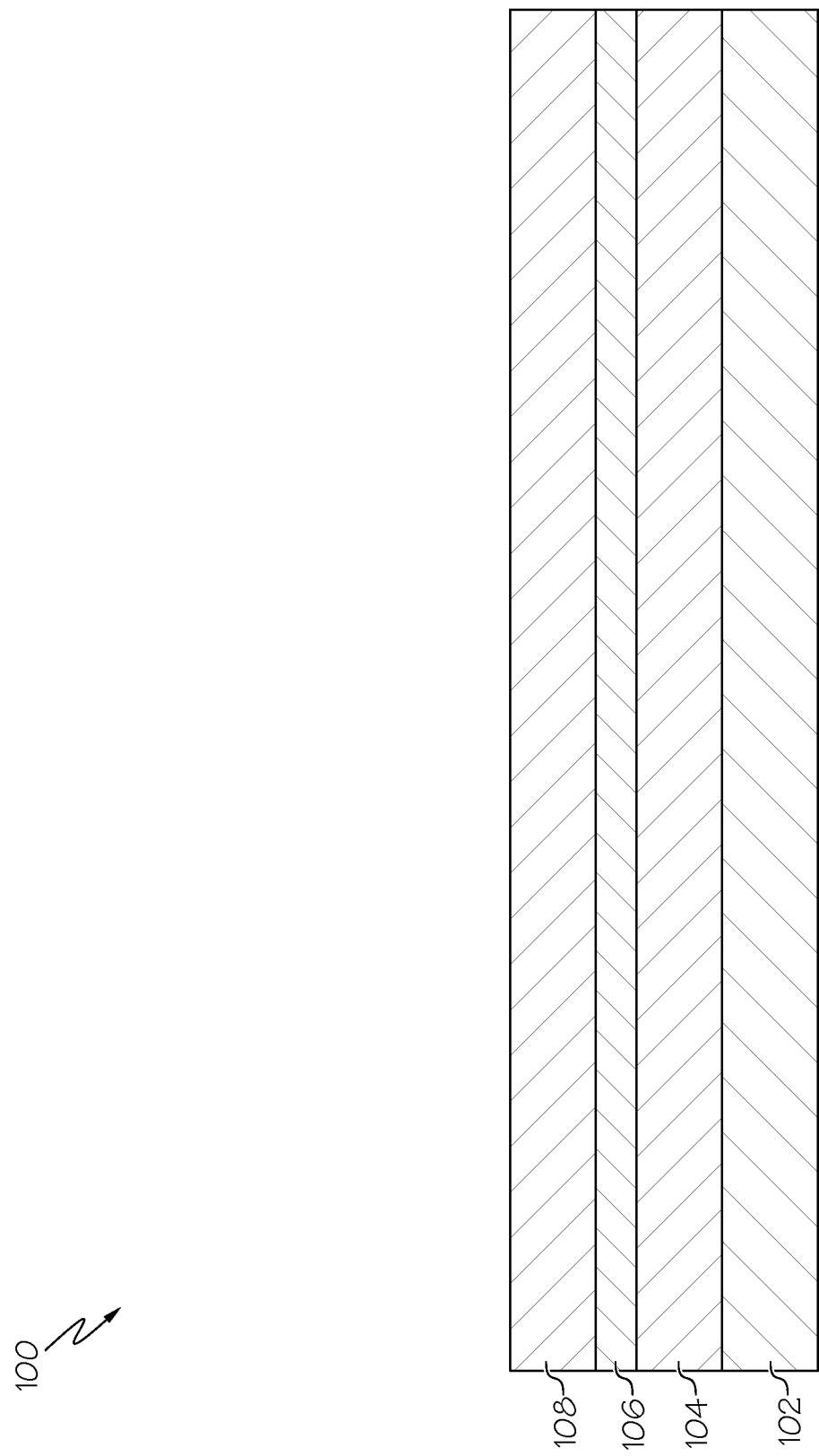
FIG. 1 is a cross-sectional side view of an example semiconductor structure at a first point in an example fabrication process such as for fabricating semiconductor devices, according to an embodiment of the present invention.

It is to be understood that the present invention will be described in terms of illustrative example fabrication processes for fabricating field-effect transistor semiconductor devices. However, other semiconductor architectures, structures, substrate materials, and process features and steps may be varied within the scope of the present invention. Various embodiments of the present invention comprise a fuse stack semiconductor structure including a plurality of fuse metal layers interleaved with a plurality of ILD layers on the same semiconductor substrate on a wafer. This structure may be used, for example, to support creation of one or more on-chip fuses electrically connected to CMOS devices in an integrated circuit. The resistance of each of these on-chip fuses can be customized (tuned) by design during a semiconductor fabrication process. The fuse stack semiconductor structure can be located in close proximity to a metallization layer, such as a front end of line (FEOL) metallization layer, a middle of line (MOL) metallization layer, or a back end of line (BEOL) metallization layer. The resistance of the fuse stack semiconductor structure can be tuned by a semiconductor fabrication process. According to one example, a value of the impedance (e.g., the resistance) of the fuse stack semiconductor structure can be tuned by any one or more of: selecting a type of conductive material of any of the first or second fuse conductive material layers; selecting a horizontal width (lateral patterning) of any of the first or second fuse conductive material layers, selecting a vertical thickness of any of the first or second fuse conductive material layers, or selecting a horizontal spacing in the fuse stack semiconductor structure between a first fuse electrical contact and a second fuse electrical contact. These examples of tuning resistance of an on-chip fuse, and other examples, will be discussed below.

It will be understood that when an element such as a layer, region or substrate is referred to as being "on" or "over" another element, it can be directly on the other element or intervening elements may also be present. Similar but inverse meaning will be understood for an element such as a layer, region, or substrate that is referred to as being "under" or "below" another element. It can be directly under the other element or intervening elements may also be present. In contrast, when an element is referred to as being "directly on" or "directly over", or alternatively referred to as being "directly under" or "directly below" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used as part of a process in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be understood that the various layers and/or regions shown in the accompanying drawings are not drawn to scale, and that one or more layers and/or regions of a type commonly used in complementary metal-oxide semiconductor (CMOS), field-effect transistor (FET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with various embodiments of the present invention can be employed in applications, hardware, and/or electronic systems. Suitable electronic hardware and systems for implementing embodiments of the invention may include, but are not limited to, personal computers, communication networks, electronic commerce systems, portable communications devices (e.g., cellular and smart phones), solid-state media storage devices, functional circuitry, etc. Systems and hardware incorporating the semiconductor devices and structures are contemplated embodiments of the invention. Given the teachings of example embodiments of the invention provided herein, one of ordinary skill in the art will be able to contemplate other implementations and applications of embodiments of the invention.

Various embodiments of the present invention can be implemented in connection with semiconductor devices, and related semiconductor fabrication processes, that may use CMOSs, MOSFETs and/or FETs technology. By way of non-limiting example, the semiconductor devices can include, but are not limited to CMOS, MOSFET, and FET devices, and/or semiconductor devices that use CMOS, MOSFET and/or FET technology.

As used herein, "vertical" refers to a direction perpendicular to a substrate in any cross-sectional and three-dimensional views herein. Current between source/drain regions can be described herein as flowing in a vertical direction (e.g., between a bottom point in a vertical non-self-aligned contact directly contacting a source-drain epi-layer and a top point in the vertical non-self-aligned contact that is above the bottom point). As used herein, "horizontal" refers to a direction parallel to a substrate in any cross-sectional and three-dimensional views herein.

As used herein, "thickness", "thick", or the like, refers to a size of an element (e.g., a layer, trench, hole, etc.) in a cross-sectional view measured from a bottom surface to a top surface, or from a left side surface to a right side surface of the element, and/or measured with respect to a surface directly adjacent to and contacting the element (e.g., a surface on which the element is directly disposed on).

Additionally, the terms "width" or "width value", and the like, refer to a distance from a start point on a structure to an end point on the same structure, in a critical dimension. For example, a width value could be horizontally measured along a critical dimension from a start point of a vertical contact metal structure to an end point on the same vertical contact metal structure.

Unless otherwise specified, as used herein, "height" or "height above a substrate" refers to a vertical size of an element (e.g., a layer, trench, hole, etc.) in a cross-sectional view measured from a top surface of the substrate to a top surface of the element. A thickness (or a vertical thickness) of an element can be equal to a height of the element if the element is directly on the substrate.

As used herein, the terms "lateral," "lateral side," "lateral surface" refer to a side surface of an element (e.g., a layer, opening, a sidewall spacer, etc.), such as a left or right side surface in a cross-sectional view herein.

As used herein, the terms "pitch" or "pitch value", and the like, refer to a distance from a point on a first semiconductor structure to a corresponding point on a second semiconductor structure, in a pattern of semiconductor structures disposed on a substrate. The points of reference may be located, for example, at a start point, at a center point, or at an endpoint, of a semiconductor structure and a corresponding adjacent semiconductor structure. For example, generally, a pitch value might be measured along a horizontal critical dimension from a start point of a first structure, e.g., a first vertical contact metal, to a start point of an adjacent second structure, e.g., a second vertical contact metal. Pitch value measurements, for example, could be taken along a horizontal critical dimension in a pattern of first, second, third, and fourth structures, measured between the first and second structures, between the second and a third structures, between the third and a fourth structures, and so forth.

The terms "pitch walk", "pitch variability", "pitch tolerances", and the like, synonymously mean herein the same type of semiconductor structure metrology to determine pitch values of adjacent semiconductor structures in a pattern disposed on a substrate. These patterns of adjacent semiconductor structures may be used, for example, to fabricate one or more of: FET semiconductor devices, transistor semiconductor devices, vertical metallization structures in metallization layers, such as in front-end-of-line (FEOL) metallization layers, middle-of-line (MOL) metallization layers, and back-end-of-line (BEOL) metallization layers, and the like.

The terms viabar or super-viabar may be used interchangeably in this disclosure, and are intended to mean an electrical interconnect structure that vertically interconnects a vertically mismatched metallization contact in, for example, a BEOL metallization layer with a semiconductor contact on a surface of a layer of a semiconductor stack below (or above) the vertically mismatched metallization contact. A viabar structure, as used herein, is defined as a generally rectangular electrical wire structure (that may be also referred to as an electrical interconnect or an electrical junction) typically extending horizontally across one metallization layer in a semiconductor structure and extending vertically across two or more layers in a material stack in the semiconductor structure. A super-viabar structure, as used herein, means a viabar structure extending horizontally across a metallization layer that is disposed on top of two or more layers in a material stack in a semiconductor structure in which the super-viabar structure is extending vertically across the two or more layers in the material stack in the semiconductor structure. The super-viabar structure provides an electrical interconnect or an electrical junction between features in the two or more layers in the material stack in the semiconductor structure.

Fuses are used in a variety of circuit applications and are needed in many technologies. It is highly desired to fabricate on-chip fuses close to FEOL/BEOL structures, for example, to support CMOS operation and improve system integration. Tuning the fuse resistive value accurately to the particular application is highly desired.

Figure 2:
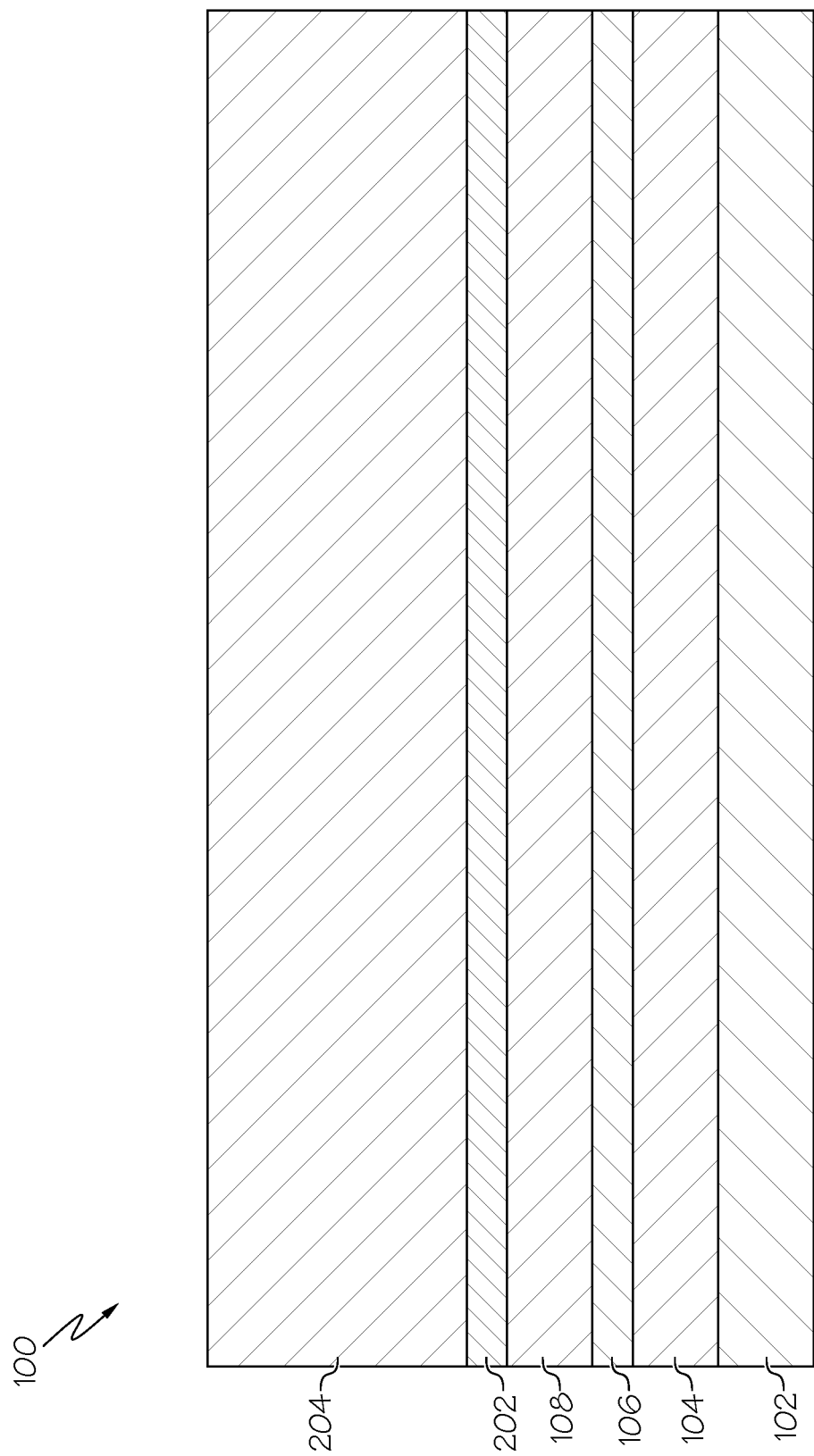
FIG. 2 is a cross-sectional side view of the example semiconductor structure of FIG. 1 at a subsequent point in the example fabrication process.
Figure 3:
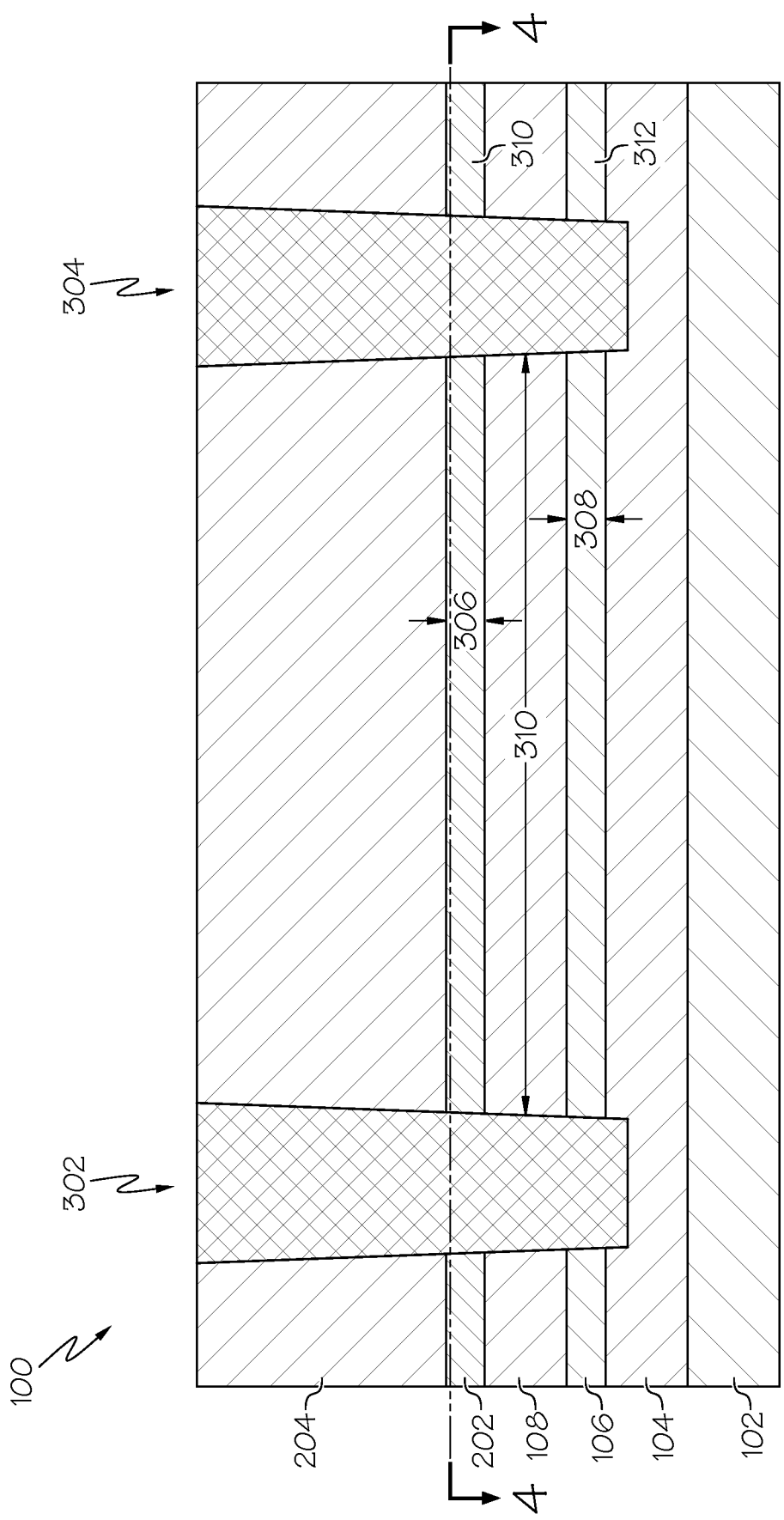
FIG. 3 is a cross-sectional side view of the example semiconductor structure of FIG. 2 at a subsequent point in the example fabrication process, showing electrical contacts formed in a fuse stack semiconductor structure, with the line 4-4 and arrows indicating a view corresponding to that shown in FIG. 4.
Figure 4:
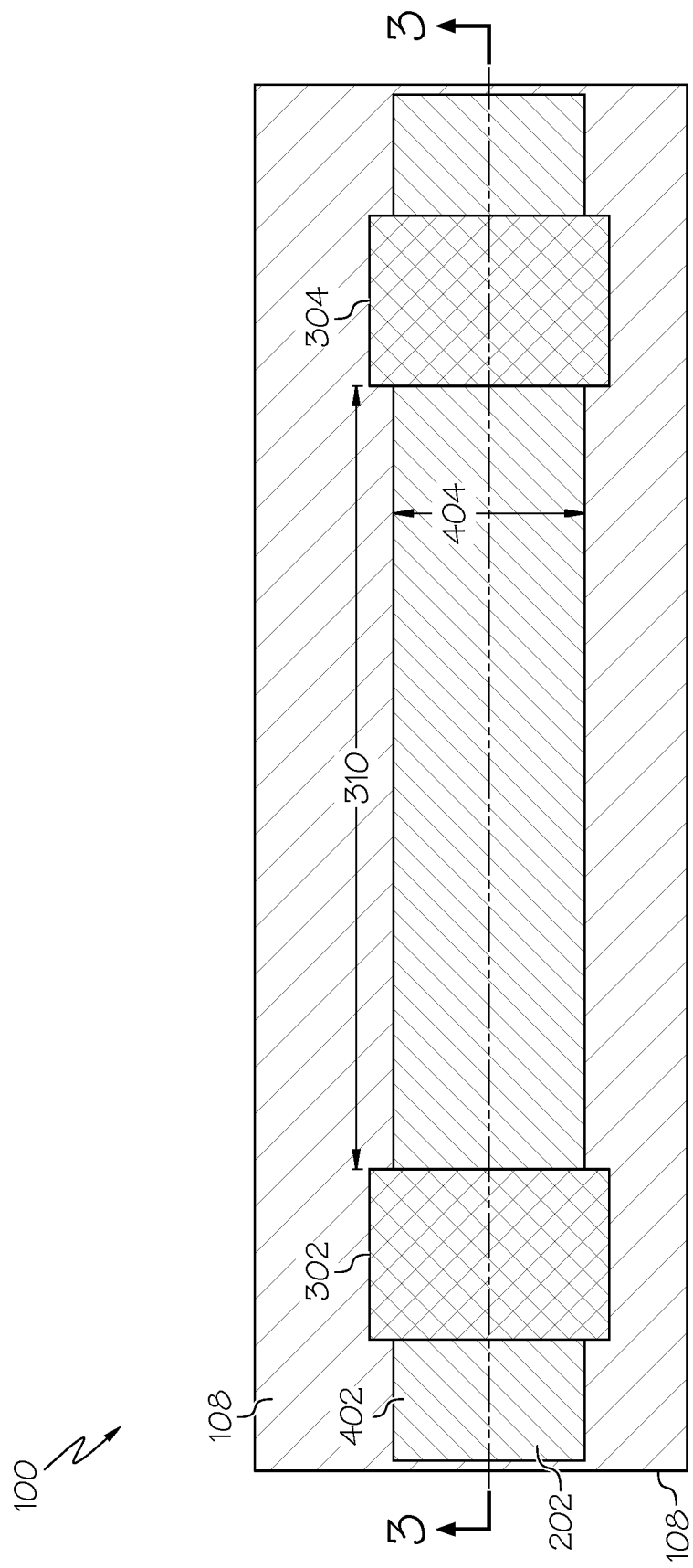
FIG. 4 is a cross-sectional top planar view of the example semiconductor structure of FIG. 3 at a point in the example fabrication process after forming electrical contacts in a fuse stack semiconductor structure, with the line 3-3 and arrows indicating a view corresponding to that shown in FIG. 3.

Referring now to the drawings in which like numerals represent the same or similar elements, FIGS. 1-3 are cross-sectional side views of a semiconductor structure in various stages of fabrication. The cross-sectional side views in FIGS. 1-3 are taken along line 3-3 shown in FIG. 4. FIG. 4 is a cross-sectional top view taken along line 4-4 shown in FIG. 3. The example semiconductor structure 100 shown in FIG. 1 will be used in the present discussion to illustrate an example semiconductor fabrication process, according to various embodiments of the invention.

As shown in FIG. 1, a semiconductor material stack includes a substrate 102. The substrate 102 may include one or more layers. For example, the substrate 102 may comprise a circuit supporting substrate. As another example, the substrate 102 may comprise a semiconductor substrate layer. The substrate 102, according to various embodiments, may comprise one or more metallization layers corresponding to a front end of line (FEOL) metallization layer, a middle of line (MOL) metallization layer, or a back end of line (BEOL) metallization layer. In various circuit applications, it can be desirable to locate a fuse structure in close proximity to such metallization layers. For example, a fuse stack structure can be fabricated using larger dimensions and more relaxed pitch, as compared to the continuously smaller and smaller miniaturized circuit structures and semiconductor devices fabricated in a semiconductor circuit in the substrate 102.

The substrate 102, for example and not for limitation, according to various embodiments may comprise at least one material selected from the following: silicon (Si), silicon germanium (SiGe), silicon carbide (SiC), Si:C (carbon doped silicon), silicon germanium carbide (SiGeC), carbon doped silicon germanium (SiGe:C), III-V compound semiconductor, or II-V compound semiconductor, an organic semiconductor, a layered semiconductor, a silicon-on-insulator, a SiGe-on-insulator, amorphous material, polycrystalline material, monocrystalline material, or a hybrid oriented (HOT) semiconductor material, or a combination of the materials in this set.

An inter-layer dielectric (ILD) layer 104 is formed on the substrate 102 by a semiconductor fabrication process. This can also be referred to herein as a substrate ILD layer 104. A first fuse metal layer 106, according to the example, is then formed directly on, and contacting, the substrate ILD layer 104, such as by depositing a first conductive material forming a first fuse conductive material layer 106. This layer 106 has a first fuse layer vertical thickness. The semiconductor fabrication process continues by depositing a first dielectric material forming a first ILD layer 108 of a first ILD vertical thickness directly on, and contacting a top surface of, the first fuse conductive material layer 106, as shown in FIG. 1. In one example embodiment, the first fuse conductive material layer 106 comprises a metal material such as aluminum (Al). In the example, the first ILD layer 108 comprises an oxide based material such as silicon dioxide (SiO2).

Figure 5:
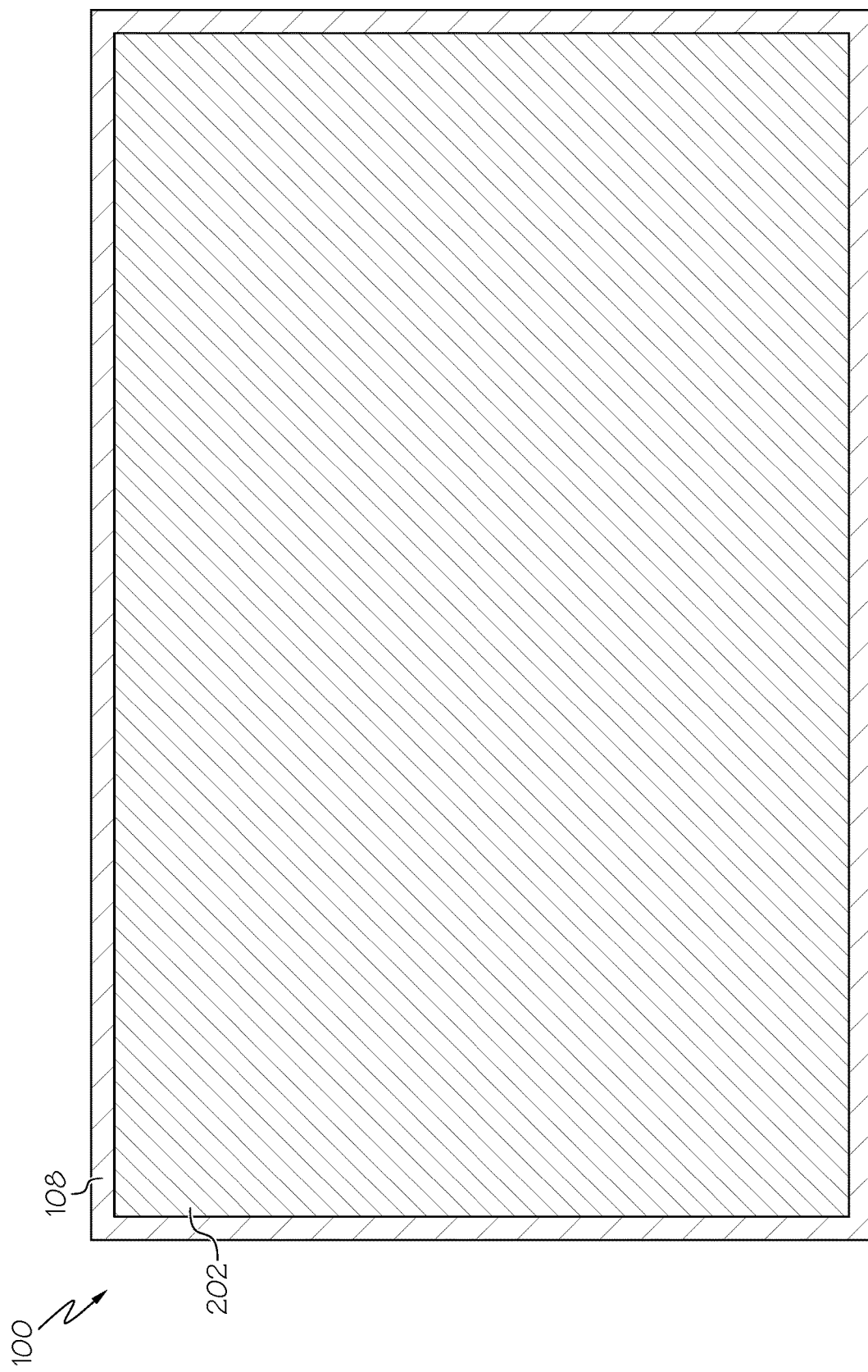
FIG. 5 is a top planar view of an example semiconductor structure at a point in an example fabrication process after a metal layer is formed on an ILD layer.

With reference to FIG. 2, the example fabrication process then forms a second fuse metal layer 202, directly on, and contacting, the first ILD layer 108, such as by depositing a second conductive material forming a second fuse conductive material layer 202. This layer 202 has a second fuse layer vertical thickness. A top view of the second fuse conductive material layer 202 disposed on, while not completely overlapping, the first ILD layer 108, at an intermediate point in the semiconductor fabrication process, is shown in FIG. 5. It should be understood that, according to various embodiments, the second fuse conductive material layer 202 can be disposed on, and completely overlapping, the first ILD layer 108.

Returning to FIG. 2, the semiconductor fabrication process continues by depositing a second dielectric material forming a second ILD layer 204 of a second ILD vertical thickness, directly on and contacting a top surface of the second fuse conductive material layer 202. In one example embodiment, the second fuse conductive material layer 202 comprises titanium nitride (TiN). In the example, the second ILD layer 204 comprises a carbon-doped oxide material such as carbon doped silicon oxide (SiCOH). As illustrated in this example, the first and second fuse conductive material layers 106, 202, can be made of different conductive materials and the two fuse conductive layers can be of different vertical thicknesses. Similarly, the first and second ILD layers 108, 204, can be made of different dielectric materials and the two ILD layers can be of different vertical thicknesses. The layers 104, 106, 108, 202, 204, according to the example, are interleaved with each other in a stack of layers forming a fuse stack semiconductor structure 100, as shown in FIG. 2. Alternative arrangements of a stack of layers, which may optionally include more or fewer layers than those shown in FIG. 2, can be used to form a fuse stack semiconductor structure according to various embodiments of the invention.

Deposition of any of the ILD layers 104, 108, 204, according to various embodiments, can be done by using a chemical vapor deposition (CVD), or a physical vapor deposition (PVD), process followed by a planarization process such as by a chemical and mechanical polishing (CMP) step or an etching step to bring the level of the particular ILD layer down to a desired level. The dielectric material of any of the ILD layers 104, 108, 204, according to various embodiments, comprises at least one dielectric material selected from the following set of dielectric materials consisting of: Silicon Nitride (SiN), Silicon Carbide (SiC), SiCO, Silicon Oxide (SiO), Silicon Dioxide (SiO2), Carbon Doped Silicon Oxide (SiCOH), SiCH, one or more silicon-based materials with some or all of the Si replaced by Ge, carbon-doped oxides, inorganic oxides, inorganic polymers, hybrid polymers, organic polymers such as polyamides or SiLK™ other carbon-base materials, organo-inorganic materials such as spin-on glasses and silsesquioxane-based materials, diamond-like carbon (DLC, also known as amorphous hydrogenated carbon, α-C:H), or any of the aforementioned materials in porous form, or in a form that changes during processing to or from being porous and/or permeable to being non-porous and/or non-permeable.

FIG. 3 illustrates a first electrical contact 302 and a second electrical contact 304 formed in the fuse stack semiconductor structure 100, according to the example. Each of the first and second electrical contacts 302, 304, can be formed by the semiconductor fabrication process according to various embodiments. According to the present example, an etching patterning mask layer (not shown) is deposited on top of the second IDL layer 204. The etching patterning mask layer can comprise one or more of an organic planarization layer (OPL), an anti-reflective coating (ARC), and a photoresist layer; and which may also be referred to as a photolithography material stack. One or more openings in the etching patterning mask layer provide a guide for via patterning of one or more via trenches as shown in FIG. 3.

For example, a first vertical directional etch can be performed in the second ILD layer 204 in the fuse stack semiconductor structure 100 forming a first vertical fuse contact trench extending downward through the second ILD layer 204, the second fuse conductive material layer 202, and the first ILD layer 108, and down to at or below the first fuse conductive material layer 106. The vertical trench can be formed using a vertical directional etching process such as using a reactive ion etching (RIE) process that etches downward through the layers 204, 202, 108, 106, to form the first vertical fuse contact trench in the fuse stack semiconductor structure 100. An example reactive ion etching (RIE) process uses a fluoride based chemistry (for example, the chemistry could include mixtures of Ar, $CHF_3$, $C_4F_8$ and $CF_4$, etc.). However, there are many alternative vertical etching processes that could be used.

Similarly to the first vertical directional etch described above, a second vertical directional etch can be performed in the second ILD layer 204 in the fuse stack semiconductor structure 100 forming a second vertical fuse contact trench. The second vertical fuse contact trench is formed extending downward through the second ILD layer 204, the second fuse conductive material layer 202, and the first ILD layer 108, down to at or below the first fuse conductive material layer 106, as shown in FIG. 3.

The example fabrication process continues by optionally forming a conductive liner/barrier film (not shown) directly on the exposed surfaces in the first and second vertical trench openings. Additionally, the conductive liner/barrier film may be formed on the top surface of the second ILD layer 204.

The conductive liner/barrier film can include, for example, a Tantalum Nitride film deposited and formed across the walls of the first and second vertical trench openings. The liner/barrier film can be, for example, a conformal Tantalum Nitride, a TaN/Ta bilayer, a Ti or TiN layer, a Co layer, or a Ru layer, or a combination of these materials deposited on the walls of the first and second vertical trench openings. The liner/barrier film deposition, according to the example, is primarily by a physical vapor deposition (PVD) technique, though processes such as ALD or CVD can be used as well. The deposition process should be performed such that it deposits conductive liner/barrier film material on the sidewalls of the first and second vertical trench openings.

After the optional deposition of the liner/barrier film into the first and second vertical trench openings, a deposition of a metal gap fill, forms first and second trench metal electrical contacts 302, 304, (also referred to as "fuse electrical contacts"), in the respective first and second vertical trench openings. This metal gap fill completes the metallization of the first and second fuse electrical contacts 302, 304. These fuse electrical contacts 302, 304, according to the example, electrically connect to the first and second fuse conductive material layers 106, 202, in the fuse stack semiconductor structure 100, as shown in FIG. 3. These electrical contacts 302, 304, can be electrically connected to electrical contacts in a semiconductor circuit on a circuit supporting substrate 102, according to various embodiments.

In this example, this metal gap fill can be deposited by PVD Copper seed followed by Copper plating, though chemical vapor deposition (CVD) techniques could be used as well. The metal gap fill can include any conductive material, e.g., a metal or metal alloy, suitable for forming the trench metal electrical contact on the conductive liner/barrier film in the first and second vertical trench openings. For example, the trench metal electrical contact 302, 304, can be made of Copper metal. Several examples of metal that can be used as the metal gap fill include: Copper, Cobalt, Ruthenium, Tungsten, or any combination thereof. However, other metals could also, or alternatively, be used in the trench metal electrical contact 302, 304, as shown in the example of FIG. 3.

According to various embodiments, the type of conductive material of any of the fuse conductive material layers, is selected from a set of conductive materials consisting of the following: tantalum nitride (TaN); titanium nitride (TiN), tungsten (W), cobalt (Co), copper (Cu), aluminum (Al), titanium (Ti), tantalum (Ta), Nickel (Ni), Platinum (Pt), a conducting metallic compound material, or a conducting metal alloy including at least one of the preceding conductive materials.

In the fabrication process, there will be a certain overburden of metal on top of a wafer from the CVD deposition of the metal fill. Some of the conductive liner/barrier film may have been formed on the top surface of the wafer. The semiconductor fabrication process, according to the example, performs a chemical mechanical planarization (CMP) process that polishes and removes the excess metal from the top of the wafer. In the present example, the CMP process also removes the liner/barrier film from the top surface of the second ILD layer 204. In a final structure, according to the certain embodiments that include a conductive liner/barrier, the conductive liner/barrier film will solely be present in the vertical electrical contact trench openings. The resulting semiconductor structure 100, after performing the CMP process in the present example fabrication process, is shown in FIGS. 3 and 4. The first fuse conductive material layer 106 has a first vertical thickness t 308, and the second fuse conductive material layer 202 has a second vertical thickness t 306. The first and second vertical thicknesses t 308, 306, can be selected by design to be different from each other. The first and second fuse conductive material layers 106, 202, in the fuse stack semiconductor structure 100, can be selected by design to comprise different conductive material from each other. The horizontal spacing distance L 310 between the first and second fuse electrical contacts 302, 304, can be varied by design. As shown in FIG. 4, the horizontal width W 404 of the first and second fuse conductive material layers 106, 202, (also collectively or individually can be referred to as a "stripe" 402) can be varied by design and by the semiconductor fabrication process. The horizontal width W 404 of the first and second fuse conductive material layers 106, 202, is formed, for example, by lateral patterning of each conductive material layer 106, 202, during the semiconductor fabrication process.

Figure 6:
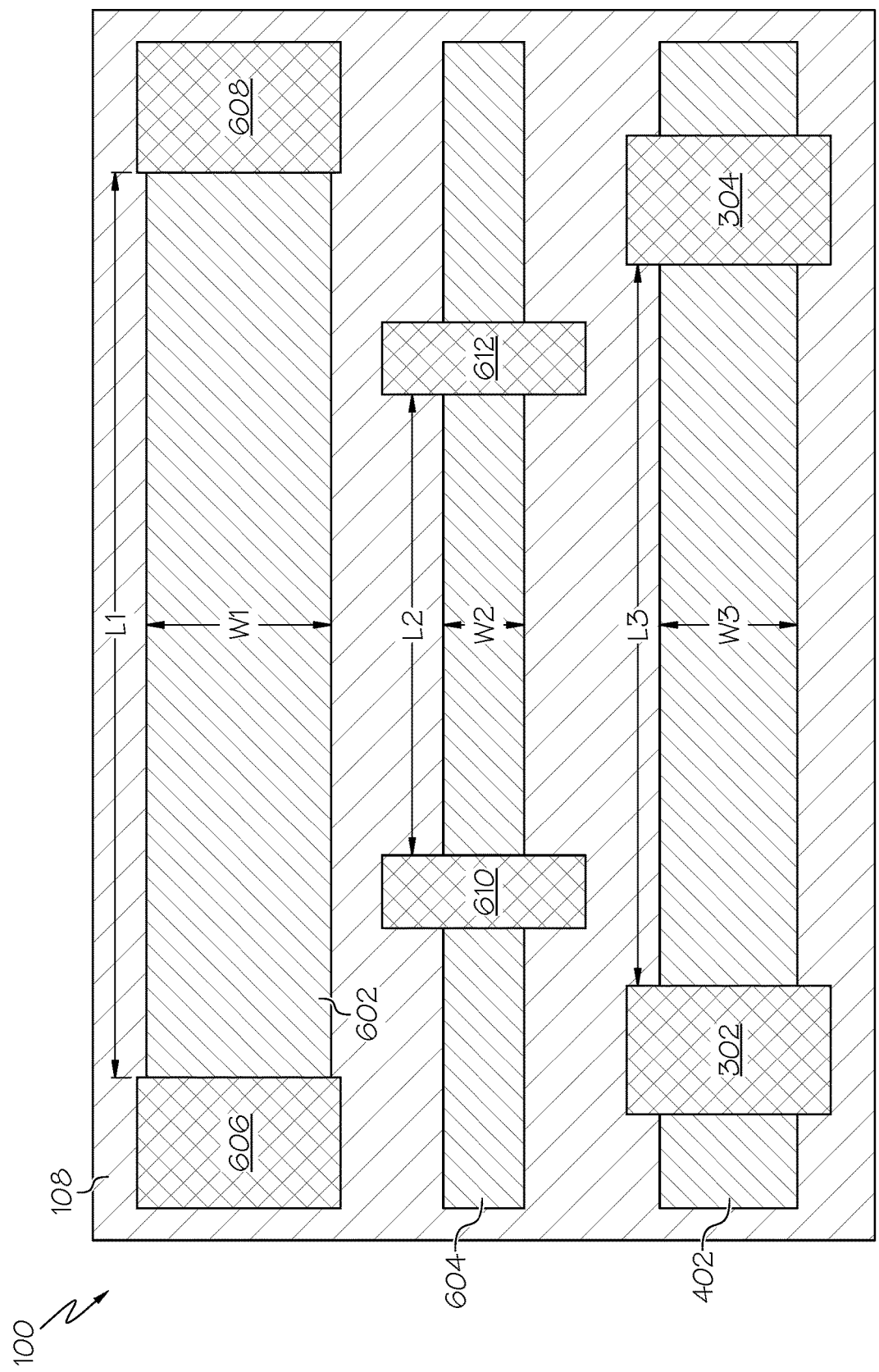
FIG. 6 is a top planar view of the example semiconductor structure of FIG. 5 at a subsequent point in the example fabrication process, after metal stripes are formed and electrical contacts are formed in the metal stripes.

A conductive material layer 202, such as shown in FIG. 5, can be laterally patterned, for example as shown in FIG. 6, using photolithography with selective placement of hard masks followed by an etching process to form stripe patterns 602, 604, and 402, in the conductive material layer 202. While FIG. 6 shows the top conductive material layer 202 having been etched to form stripes 602, 604, and 402, a similar process can be used to form stripes (not shown) in the lower layer of conductive material 106. The stripes 602, 604, and 402, in the conductive material layer 202, are disposed directly over the stripes (not shown) in the lower layer of conductive material 106, according to the example. The stripes 602, 604, and 402, are vertically separated from the stripes (not shown) in the lower layer of conductive material 106, by an ILD layer 108. The layers are stacked and interleaved with each other in a stack of layers forming a fuse stack semiconductor structure 100. In the example shown in FIG. 6, the stacked and interleaved layers form three separate fuses indicated by the stripes 602, 604, 402, each with a separate pair of fuse electrical contacts.

A first fuse includes a first fuse stripe 602 with a first electrical contact 606 and a second electrical contact 608. The first fuse stripe 602 has a first fuse stripe horizontal width W1 and a first fuse stripe horizontal length L1 as shown in FIG. 6.

A second fuse includes a second fuse stripe 604 with a first electrical contact 610 and a second electrical contact 612. The second fuse stripe 604 has a second fuse stripe horizontal width W2 and a second fuse stripe horizontal length L2 as shown in FIG. 6.

A third fuse includes a third fuse stripe 402 with a first electrical contact 302 and a second electrical contact 304. The third fuse stripe 402 has a third fuse stripe horizontal width W3 and a third fuse stripe horizontal length L3 as shown in FIG. 6. This third fuse, according various embodiments, corresponds to the fuse structure that is illustrated with reference to FIGS. 3 and 4, and which has been discussed above.

As shown in FIG. 6, the three example fuses indicated by the three separate fuse stripes 602, 604, and 402, can have different fuse resistances from each other. Each of the three fuses can also be referred to as a separate fuse stack semiconductor structure 100 with its own separate pair of fuse electrical contacts.

Figure 7:
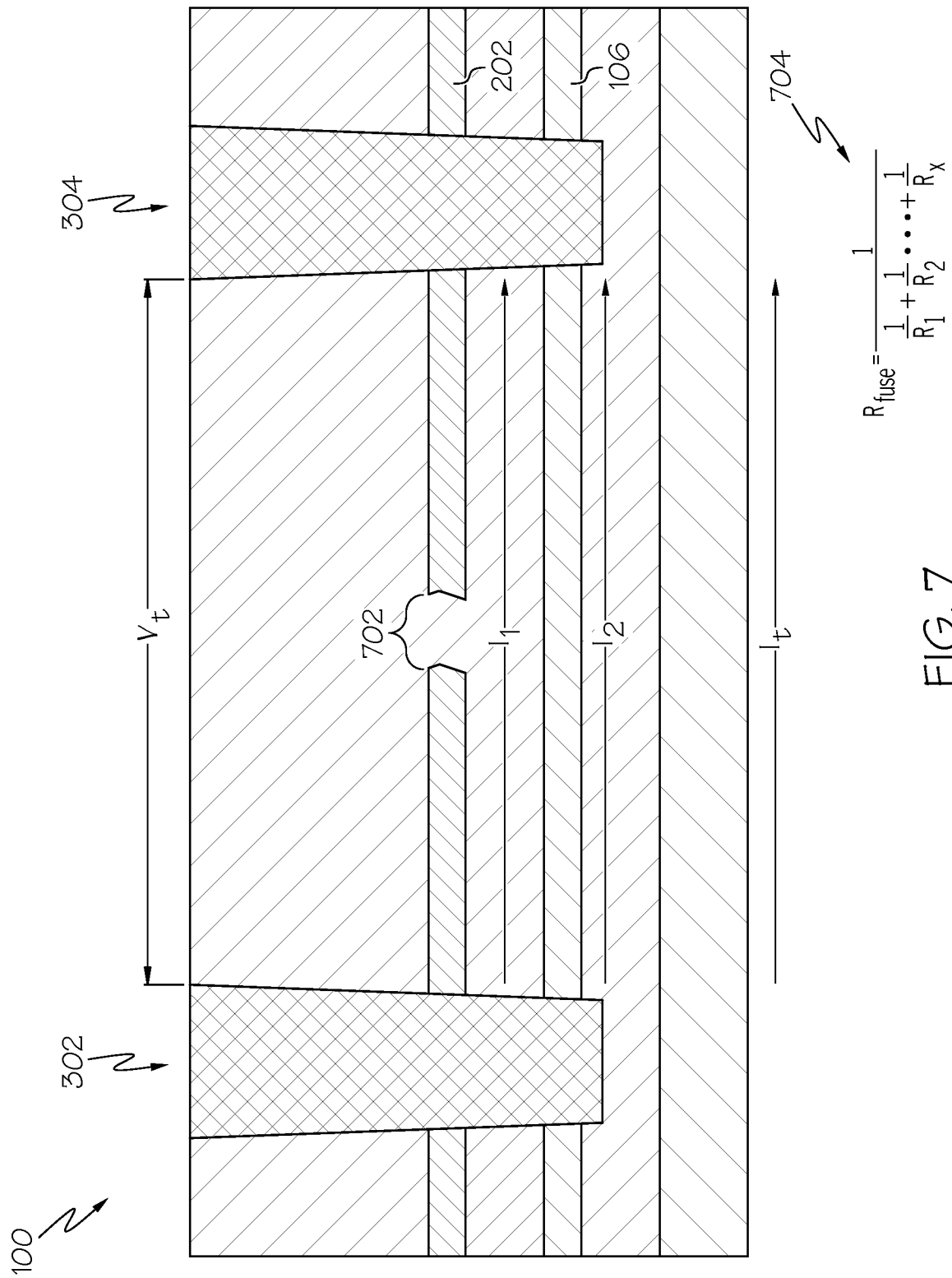
FIG. 7 is a cross-sectional side view of an example semiconductor structure illustrating a fuse metal layer in a plurality of fuse metal layers being blown, causing a change in fuse resistance value between two electrical contacts formed in a fuse stack semiconductor structure.

FIG. 7 illustrates an example operation of a fuse stack semiconductor structure 100 such as the one shown in FIGS. 3 and 4. The resistance value and the breakdown voltage of the fuse stack structure 100, can be defined by choice of a type of thin metal material of each fuse layer 202, 106, a vertical thickness of each thin metal fuse layer 202, 106, a lateral patterning (horizontal width) of each fuse layer 202, 106, or stripe, and a contact horizontal spacing between two fuse contacts 302, 304.

The example fuse stack semiconductor structure 100 in FIG. 7 is shown after blowing one fuse layer 202, while the other fuse layer 106 remains intact. The resistance of the fuse stack semiconductor structure 100 varies from a first resistance value, with both fuse layers 202, 106, being intact as shown in FIG. 3, to a second resistance value, with one fuse layer 202 blown (open circuit) 702 while the other fuse layer 106 remains intact as shown in FIG. 7. The resistance of the fuse stack semiconductor structure 100 can also change to a third resistance value, with both fuse layers 106, 202 blown (open circuit) 702 which is not shown. As can be calculated using the resistance formula 704 shown in FIG. 7, there are three separate resistance values—i.e., lowest value, middle value, and highest value, for the fuse stack semiconductor structure 100.

The resistance of the fuse stack semiconductor structure 100, in the current example, is equal to the parallel resistance of the two fuse layers 106, 202. This can be calculated using the resistance formula 704, once the resistance of each fuse layer 106, 202, is known. The resistance $R_{fuse}$ of the fuse stack semiconductor structure 100 is given by dividing the total voltage $V_t$ between the two fuse electrical contacts by the total current $I_t$ between the two fuse electrical contacts. The total current $I_t$ is equal to the current through one of the fuse layers $I_1$ plus the current through the other fuse layer $I_2$. The calculation of the total fuse resistance $R_{fuse}$ is, in the present example, the inverse of the algebraic sum of the reciprocal values of the individual resistances of the first fuse layer 106 and the second fuse layer 202.

For example, if the first fuse layer 106 has a resistance value of 5 and the second fuse layer 202 has a resistance value of 2, the total resistance value $R_{fuse}$ of the fuse stack semiconductor structure 100 is 1.4. This is the lowest resistance value for the fuse stack semiconductor structure 100. If the second fuse layer 202 blows (is disconnected and becomes an open circuit), then the total resistance value $R_{fuse}$ of the fuse stack semiconductor structure 100 is 5. This is the middle resistance value. The total fuse resistance in this example has increased by approximately a factor of three. Finally, after both the first and second fuse layers 106, 202, have blown, the total resistance value $R_{fuse}$ of the fuse stack semiconductor structure 100 becomes an open circuit. This is the highest resistance value.

According to certain embodiments of the invention, for example in certain circuit applications, it may desirable to have an incremental ramping up of the resistance value $R_{fuse}$ of the fuse stack semiconductor structure 100. Individual fuse layers 106, 202, can be designed and fabricated such that the fuse resistance can progressively increment in steps until reaching its highest resistance value.

Figure 8:
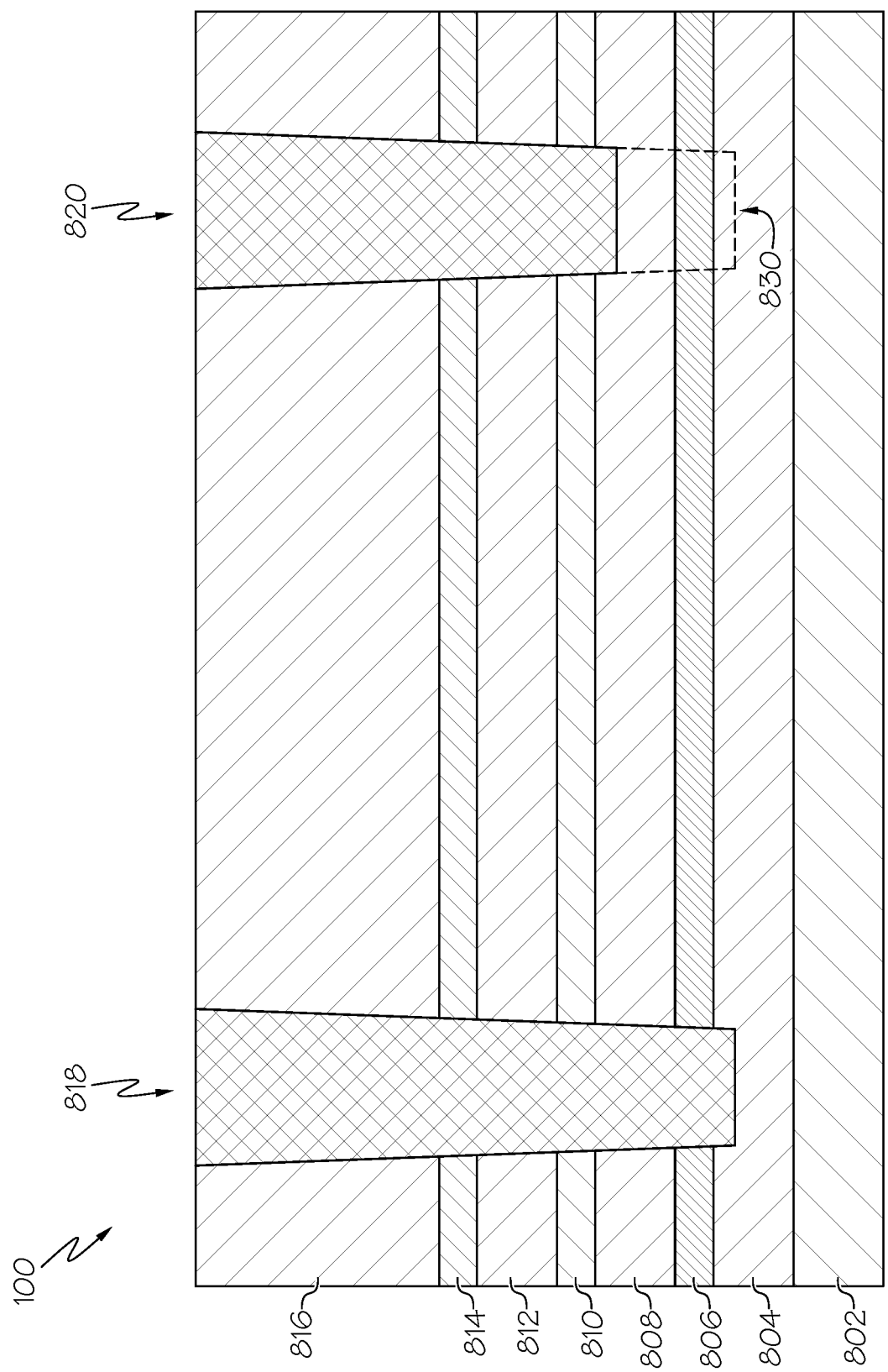
FIG. 8 is a cross-sectional side view of an example semiconductor structure illustrating formation of electrical contacts in a fuse stack semiconductor structure including three fuse metal layers, according to various embodiments of the invention.

FIG. 8 illustrates an alternative example arrangement of the fuse stack semiconductor structure 100, according to various embodiments. The fuse stack semiconductor structure 100, in this example, uses first, second, and third fuse conductive layers 806, 810, 814, interleaved with first, second, and third ILD layers 808, 812, 816. In this example, a substrate ILD layer 804 is disposed directly on, and contacting, a top surface of a substrate 802. The remaining stack of layers 806, 808, 810, 812, 814, 816, in the fuse stack semiconductor structure 100, is disposed on, and contacting, a top surface of the substrate ILD layer 804, as shown in FIG. 8.

A first fuse contact 818 is formed in the fuse stack semiconductor structure 100, and extends downward through the third ILD layer 816, the third fuse conductive layer 814, the second ILD layer 812, the second fuse conductive layer 810, the first ILD layer 808, and down to at or below the first fuse conductive layer 806. The first fuse contact 818 is electrically connected to the first, second, and third fuse layers 806, 810, 814.

A second fuse contact 820 is formed in the fuse stack semiconductor structure 100, wherein the vertical depth of the second fuse contact 820 can be selected by design and by a fabrication process to selectively make electrical contact with one of three optional depths. The second fuse contact 820, according to a first alternative design, is fabricated extending downward through the third ILD layer 816, and down to at or below the third fuse conductive layer 814. According to a second alternative design, the second fuse contact 820 is fabricated extending downward through the third ILD layer 816, the third fuse conductive layer 814, the second ILD layer 812, and down to at or below the second fuse conductive layer 810. According to a third alternative design, the second fuse contact 820 is fabricated extending downward through the third ILD layer 816, the third fuse conductive layer 814, the second ILD layer 812, the second fuse conductive layer 810, the first ILD layer 808, and down to a vertical depth 830 at or below the first fuse conductive layer 806. The various alternative designs, according the example, allow a semiconductor fabrication process to select first, second, or third resistance value for the fuse stack semiconductor structure 100 based on the selected depth of the second fuse contact 820, as shown in FIG. 8. The semiconductor fabrication process can be simple and low cost, while having flexibility to select any one of a plurality of fuse resistances for the fuse stack semiconductor structure 100.

According to certain embodiments, the vertical thickness of the first ILD layer 808 can be selected to be larger than the vertical thickness of the second ILD layer 812. This larger separation depth of the first ILD layer 808 can facilitate a semiconductor fabrication process to select between a) the second fuse contact 820 being in electrical contact with the third and second fuse conductive layer 814, 810, or b) the second fuse contact 820 being in electrical contact with the third, second, and first fuse conductive layers 814, 810, 806. Each selectable depth a) or b) can correspond to a different resistance value for the fuse stack semiconductor structure 100 (measured between the two fuse electrical contacts 818, 820) based on the selected depth of the second fuse contact 820, as shown in FIG. 8. This new and novel feature, according to various embodiments of the invention, provides significant advantages to a fabrication process for making fuses for a semiconductor circuit application.

Figure 9:
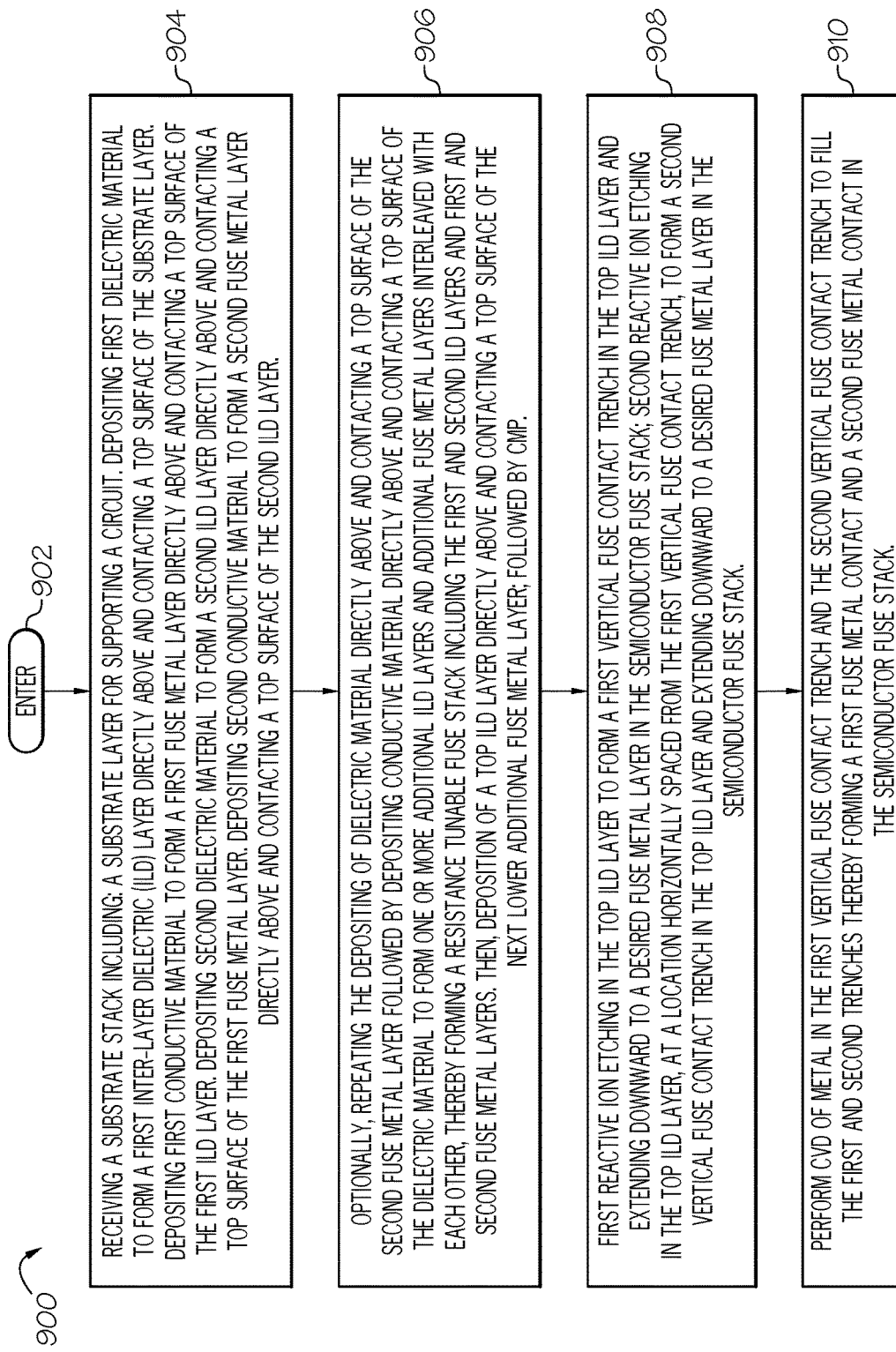
FIG. 9 is an operational flow diagram illustrating an example fabrication process for fabricating an example semiconductor structure including a fuse stack semiconductor structure, according to an embodiment of the present invention.

FIG. 9 illustrates an example semiconductor fabrication process 900 according to an embodiment of the present invention. This is only one example fabrication process. Various embodiments of the invention may include some, and not necessarily all, of the method steps in the illustrated example.

The fabrication method enters, at step 902, and immediately proceeds, at step 904, to receive a substrate stack including a substrate layer 802 for supporting a circuit. The several method steps generally discussed below have been described in more detail in the examples discussed above, which such details may not be repeated below for brevity.

The method, according to the example, deposits a first dielectric material forming a first inter-layer dielectric (ILD) layer 804 directly above and contacting a top surface of the substrate layer 802. The method continues by depositing first conductive material forming a first fuse metal layer 806 directly above and contacting a top surface of the first ILD layer 804. Then, a second dielectric material is deposited forming a second ILD layer 808 directly above and contacting a top surface of the first fuse metal layer 806. A second conductive material is then deposited forming a second fuse metal layer 810 directly above and contacting a top surface of the second ILD layer 808.

The method then proceeds, at step 906, to optionally continuously repeat the deposition of dielectric material directly above and contacting a top surface of the second fuse metal layer 810 followed by deposition of conductive material directly above and contacting a top surface of the dielectric material to form one or more additional ILD layers 812, 816, and one or more additional fuse metal layers 814. The deposition of layers continues until a desired number of layers are formed in a stack of layers, according to a particular design for a resistance tunable fuse stack structure 100. According to one example, as illustrated with reference to FIG. 8, all of the formed layers 802, 804, 806, 808, 810, 812, 814, 816, are stacked and interleaved with each other, thereby forming a resistance tunable fuse stack structure 100. The fuse stack structure 100 includes, in this example, at least the first and second ILD layers 804, 808, and the first and second fuse metal layers 806, 810. The fabrication method continues by deposition of a top ILD layer 816 directly above and contacting a top surface of the next lower additional fuse metal layer 814, followed by performing a CMP process on the top layer of the resistance tunable fuse stack structure 100.

The fabrication method, at step 908, performs a first vertical directional etching process, such as a reactive ion etching process (dry etch), in the top ILD layer 816 forming a first vertical fuse contact trench in the top ILD layer 816. An example of a reactive ion etching (RIE) process uses a fluoride based chemistry. This is also referred to as a "dry etch" or "isotropic dry etch" using a fluoride based chemistry. The first vertical fuse contact trench is formed extending downward through the layers 816, 814, 812, 810, 808, and down to at or below a desired fuse metal layer 806 in the semiconductor fuse stack 100.

Similarly, a second vertical directional etching process, such as a reactive ion etching process (dry etch), in the top ILD layer 816 is performed forming a second vertical fuse contact trench in the top ILD layer 816 at a location horizontally spaced from the first vertical fuse contact trench. The second vertical directional etching process forms the second vertical fuse contact trench in the top ILD layer 816 and extending downward through the layers 816, 814, 812, 810, 808, and down to at or below a desired fuse metal layer 806 in the semiconductor fuse stack 100.

The depth of the second vertical fuse contact trench can be selected so that, after a metal fill of the first and second vertical fuse contact trenches forms first and second fuse metal contacts 818, 820, the second fuse metal contact 820 can be formed to selectively make electrical contact with at least one of the set of fuse metal layers 814, 810, 806, in the semiconductor fuse stack 100. That is, for example, the second fuse metal contact 820 can make electrical contact with either a) the third fuse metal layer 814, b) the third and second fuse metal layers 814, 810, or c) the third, second, and first fuse metal layers 814, 810, 806.

Optionally, as has been described above, the fabrication method forms a conductive liner/barrier film (not shown) directly on the exposed surfaces in the first and second vertical fuse contact trenches. The deposition of the liner/barrier film, according to one example process, has been described above and will not be repeated here.

The example fabrication method, at step 908, then performs a CVD process of metal, or a metal reflow process, in the first vertical fuse contact trench and the second vertical fuse contact trench filling the first and second trenches with metal fill. The metal fill of the first and second vertical fuse contact trenches forms a first fuse metal contact 818 and a second fuse metal contact 820 in the semiconductor fuse stack 100. This may be followed by a CMP process that removes excess metal from the top of a wafer. The method then exits, at step 912.

The design and fabrication of the fuse stack structure 100 can be fabricated using larger dimensions and more relaxed pitch, as compared to the continuously smaller and smaller miniaturized circuit structures and semiconductor devices fabricated in a semiconductor circuit in the substrate 802. Additionally, the semiconductor process 900 performed to fabricate the fuse stack structure TOO benefits from reduced fabrication defects and from a reduced overall fabrication cost.

Although specific embodiments of the invention have been disclosed, those having ordinary skill in the art will understand that changes can be made to the specific embodiments without departing from the scope of the invention.

The scope of the invention is not to be restricted, therefore, to the specific embodiments, and it is intended that the appended claims cover any and all such applications, modifications, and embodiments within the scope of the present invention.

It should be noted that some features of the present invention might be used in one embodiment thereof without use of other features of the present invention. As such, the foregoing description should be considered as merely illustrative of the principles, teachings, examples, and exemplary embodiments of the present invention, and not a limitation thereof.

In addition, these embodiments are only examples of the many advantageous uses of the innovative teachings herein. In general, statements made in the specification of the present application do not necessarily limit any of the various claimed inventions. Moreover, some statements may apply to some inventive features but not to others.

What is claimed is:

1. A semiconductor structure comprising:
a semiconductor material stack; and
a fuse stack semiconductor structure disposed on the semiconductor material stack, the fuse stack semiconductor structure comprising:
a plurality of fuse conductive material layers, including first and second fuse conductive material layers, vertically interleaved with a plurality of ILD layers, including substrate, first, and second ILD layers, the first fuse conductive material layer formed directly on, and contacting a top surface of, the substrate ILD layer, the first ILD layer formed directly on, and contacting a top surface of, the first fuse conductive material layer, the second fuse conductive material layer formed directly on, and contacting a top surface of, the first ILD layer, and the second ILD layer formed directly on, and contacting a top surface of, the second fuse conductive material layer;
a first fuse contact, comprising conductive material, extending vertically downward through the second ILD layer, through the second fuse conductive material layer, through the first ILD layer, and down to at or through and below the first fuse conductive material layer; and
a second fuse contact, comprising conductive material, extending vertically downward through the second ILD layer, through the second fuse conductive material layer, through the first ILD layer, and down to at or through and below the first fuse conductive material layer.

2. The semiconductor structure of claim 1, wherein a type of conductive material, and a vertical thickness, of the first fuse conductive material layer is different from a type of conductive material, and a vertical thickness, of the second fuse conductive material layer.

3. The semiconductor structure of claim 1, wherein a type of conductive material of each of the first and second fuse conductive material layers is selected from a set of conductive materials consisting of: tantalum nitride (TaN); titanium nitride (TiN), tungsten (W), cobalt (Co), copper (Cu), aluminum (Al), titanium (Ti), tantalum (Ta), Nickel (Ni), Platinum (Pt), a conducting metallic compound material, and a conducting metal alloy including at least one of the preceding conductive materials.

4. A semiconductor structure comprising:
a semiconductor material stack; and
a fuse stack semiconductor structure disposed on the semiconductor material stack, the fuse stack semiconductor structure comprising:
a plurality of fuse conductive material layers, including first and second fuse conductive material layers, vertically interleaved with a plurality of ILD layers, including substrate, first, and second ILD layers, the first fuse conductive material layer formed directly on, and contacting a top surface of, the substrate ILD layer, the first ILD layer formed directly on, and contacting a top surface of, the first fuse conductive material layer, the second fuse conductive material layer formed directly on, and contacting a top surface of, the first ILD layer, and the second ILD layer formed directly on, and contacting a top surface of, the second fuse conductive material layer; and further comprising:
an additional fuse conductive material layer disposed directly on and contacting a top surface of the second ILD layer;
an additional ILD layer disposed directly on and contacting a top surface of the additional fuse conductive material layer, wherein the first fuse conductive material layer, the first ILD layer, the second fuse conductive material layer, the second ILD layer, the additional fuse conductive material layer, and the additional ILD layer, are interleaved with each other in a stack of layers forming the fuse stack semiconductor structure;
a first fuse contact, comprising conductive material, extending vertically downward through the additional ILD layer, through the additional fuse conductive material layer, through the second ILD layer, through the second fuse conductive material layer, and through the first ILD layer, down to at or through and below the first fuse conductive material layer; and
a second fuse contact, comprising conductive material, extending vertically downward through the additional ILD layer, through the additional fuse conductive material layer, through the second ILD layer, at or through and below the second fuse conductive material layer, at a vertical depth of the second fuse contact without making electrical contact with the first fuse conductive material layer.

5. The semiconductor structure of claim 4, wherein a vertical thickness of the first fuse conductive material layer, in the fuse stack semiconductor structure, is different from a vertical thickness of the second fuse conductive material layer in the fuse stack semiconductor structure.

6. The semiconductor structure of claim 4, wherein a type of conductive material of any one of a set of
the first fuse conductive material layer,
the second fuse conductive material layer, and
the additional fuse conductive material layer,
is a different type of conductive material from another one of the set.

7. A semiconductor structure comprising:
a semiconductor material stack; and
a fuse stack semiconductor structure disposed on the semiconductor material stack, the fuse stack semiconductor structure comprising:
a plurality of fuse conductive material layers, including first and second fuse conductive material layers, vertically interleaved with a plurality of ILD layers, including substrate, first, and second ILD layers, the first fuse conductive material layer formed directly on, and contacting a top surface of, the substrate ILD layer, the first ILD layer formed directly on, and contacting a top surface of, the first fuse conductive material layer, the second fuse conductive material layer formed directly on, and contacting a top surface of, the first ILD layer, and the second ILD layer formed directly on, and contacting a top surface of, the second fuse conductive material layer; and a plurality of fuse contacts comprising a first fuse contact and a second fuse contact, wherein the first fuse contact comprising conductive material and extending vertically downward through the second ILD layer, through the second fuse conductive material layer, through the first ILD layer, and down to at or through and below the first fuse conductive material layer.

8. The semiconductor structure of claim 7, wherein the second fuse contact comprising conductive material and extending vertically downward through the second ILD layer, and down to at or through and below the second fuse conductive material layer.

9. The semiconductor structure of claim 7, wherein a type of conductive material, and a vertical thickness, of the first fuse conductive material layer is different from a type of conductive material, and a vertical thickness, of the second fuse conductive material layer.

10. The semiconductor structure of claim 7, wherein a type of conductive material of each of the first and second fuse conductive material layers is selected from a set of conductive materials consisting of: tantalum nitride (TaN); titanium nitride (TiN), tungsten (W), cobalt (Co), copper (Cu), aluminum (Al), titanium (Ti), tantalum (Ta), Nickel (Ni), Platinum (Pt), a conducting metallic compound material, and a conducting metal alloy including at least one of the preceding conductive materials.

11. The semiconductor structure of claim 7, wherein the fuse stack semiconductor structure further comprising:

an additional fuse conductive material layer disposed directly on and contacting a top surface of the second ILD layer;

an additional ILD layer disposed directly on and contacting a top surface of the additional fuse conductive material layer, wherein the first fuse conductive material layer, the first ILD layer, the second fuse conductive material layer, the second ILD layer, the additional fuse conductive material layer, and the additional ILD layer, are interleaved with each other in a stack of layers forming the fuse stack semiconductor structure; and the first fuse contact, comprising conductive material, extending vertically downward through the additional ILD layer, through the additional fuse conductive material layer, through the second ILD layer, through the second fuse conductive material layer, through the first ILD layer, and down to at or through and below the first fuse conductive material layer.

12. The semiconductor structure of claim 11, wherein the second fuse contact comprising conductive material and extending vertically downward through the additional ILD layer, through the additional fuse conductive material layer, through the second ILD layer, and down to at or through and below the second fuse conductive material layer at a vertical depth of the second fuse contact without making electrical contact with the first fuse conductive material layer.

13. The semiconductor structure of claim 11, wherein a vertical thickness of the first fuse conductive material layer, in the fuse stack semiconductor structure, is different from a vertical thickness of the second fuse conductive material layer in the fuse stack semiconductor structure.

14. The semiconductor structure of claim 11, wherein a type of conductive material of any one of a set of the first fuse conductive material layer,
the second fuse conductive material layer, and
the additional fuse conductive material layer, is a different type of conductive material from another one of the set.

* * * * *